(12) United States Patent
Levin

(10) Patent No.: US 11,742,795 B2
(45) Date of Patent: Aug. 29, 2023

(54) CONCENTRATING PHOTOVOLTAIC MODULE

(71) Applicant: Alexander Levin, Binyamina (IL)

(72) Inventor: Alexander Levin, Binyamina (IL)

( * ) Notice: Subject to any disclaimer, the term of this patent is extended or adjusted under 35 U.S.C. 154(b) by 140 days.

(21) Appl. No.: 16/558,222

(22) Filed: Sep. 2, 2019

(65) Prior Publication Data
US 2021/0066526 A1 Mar. 4, 2021

(51) Int. Cl.
*H02S 40/42* (2014.01)
*H01L 31/054* (2014.01)
*H02S 40/22* (2014.01)
*H02S 20/32* (2014.01)
*H02S 40/44* (2014.01)

(52) U.S. Cl.
CPC .......... *H02S 40/42* (2014.12); *H01L 31/0547* (2014.12); *H02S 20/32* (2014.12); *H02S 40/22* (2014.12); *H02S 40/44* (2014.12)

(58) Field of Classification Search
CPC .......... H02S 20/32; H02S 40/22; H02S 40/40; H02S 40/42; H02S 40/425; H02S 40/44; H01L 31/0521; H01L 31/0547
See application file for complete search history.

(56) References Cited

U.S. PATENT DOCUMENTS

2006/0169315 A1* 8/2006 Levin .................. H01L 31/0547
136/246

* cited by examiner

*Primary Examiner* — Lindsey A Buck

(57) ABSTRACT

This invention relates to a photovoltaic module intended to convert solar radiation energy in electricity, and, more specifically, to a concentrating photovoltaic module provided with a parabolic dish-shaped mirror and a small-size photovoltaic receiver positioned in the focal plane of this parabolic dish-shaped mirror and the focal spot is overlapped mostly by the photovoltaic receiver. The photovoltaic module is based on usage of combination of a two-phase thermosiphon, which includes a flexible sub-section designed as a bellows, with the parabolic dish-shaped mirror installed on the distal (lower) sub-section of the two-phase thermosiphon by the truss struts. A tracking manipulator is installed below the parabolic dish-shaped mirror and joined with a certain spot of a supporting structure of the parabolic dish-shaped mirror; it provides orientation of the axis of the dish-shaped mirror towards the sun.

7 Claims, 2 Drawing Sheets

CONCENTRATING PHOTOVOLTAIC MODULE

BACKGROUND OF THE INVENTION

This invention related to the area of CPV (Concentrating Photovoltaics); it is a concentrating photovoltaic technology that generates electricity from sunlight. Contrary to conventional photovoltaic systems, it uses lenses and curved mirrors to focus sunlight onto small, but highly efficient, solar cells; preferably, multi junction (MJ) solar cells. In addition, CPV systems often use solar trackers and sometimes a cooling system to further increase their efficiency.

Ongoing research and development are rapidly improving their competitiveness in the utility-scale segment and in areas of high insolation. This sort of solar technology can be thus used in smaller areas.

Systems using high-concentration photovoltaics (HCPV) especially have the potential to become competitive in the near future. They possess the highest efficiency of all existing PV technologies, and a smaller photovoltaic array also reduces the balance of system costs.

The author of this invention tried to solve the problems of cooling photovoltaic cells in HCPV in his US Patent Application No. 20060169315.

U.S. Pat. No. 9,437,766 describes a method for operating a photovoltaic thermal hybrid system having a hybrid solar receiver with a photovoltaic module, operatively coupled to the system to deliver an electrical output power for a power user, a thermal collector distinct from the photovoltaic module, wherein the photovoltaic module and/or the thermal collector are movably mounted in the system, a collector thermal storage thermally connected to the thermal collector to store heat collected at the thermal collector, and a positioning mechanism adapted to move the photovoltaic module and/or the thermal collector.

The method includes instructing the positioning mechanism to move the photovoltaic module and/or the thermal collector to change a ratio of an intensity of radiation received at the photovoltaic module to an intensity of radiation received at the thermal collector.

There are some articles, which describe application of heat pipes for cooling photovoltaic cells in HCPV:

William G. Anderson et al. "Heat Pipe Cooling of Concentrating Photovoltaic (CPV) Systems" American Institute of Aeronautics and Astronautics, July 2008.

Akbarzadeh, A., and Wadowski, T., "Heat Pipe-Based Cooling Systems for Photovoltaic Cells Under Concentrated Solar Radiation," Applied Thermal Engineering, 16(1), pp. 81-87, 1996.

Beach, R. T., and White, R. M., "Heat Pipe for Passive Cooling of Concentration Solar Cells," Proceedings of the 15th IEEE Photovoltaic Specialists Conference, pp. 75-80, Kissimmee, Fla., May 12-15, 1981.

Farahat, M. A., "Improvement in the Thermal Electric Performance of a Photovoltaic Cells by Cooling and Concentration Techniques," proceeding of the 39th International Universities Power Engineering Conference (UPEC 2004), IEEE, New York, N.Y., ISBN: 1-86043-365-0, pp. 623-628, Sep. 6-8, 2004.

Feldman, K. T., Kenney, D. D., and Edenburn, M. W., "A Passive Heat Pipe Cooled Photovoltaic Receiver," Proceedings of the 15th IEEE Photovoltaic Specialists Conference, pp. 165-172, Kissimmee, Fla., May 12-15, 1981.
[0013] Royne, A., Dey, C. J., and Mills, D. R., "Cooling of Photovoltaic Cells Under Concentrated Illumination: A Critical Review," Solar Energy Materials and Solar Cells, 86(4), pp. 451-483, April 2005.

In addition, a book of M. K. Bezrodny et al. "TRANSFER PROCESSES IN TWO-PHASE THERMOSIPHON SYSTEMS. Theory and Practice", Kiev 2005 (in Russian) should be noted.

Some technical solutions of this invention are based on the theory of two-phase thermosiphons developed in this book.

BRIEF SUMMARY OF THE INVENTION

The main technical solutions of the invention include following elements:

a two-phase thermosiphon intended to cool photovoltaic cells being installed on the external end butt of a plug sealing the lower section of the two-phase thermosiphon;

the lower section of the two-phase thermosiphon is divided onto three sub-sections: a distal rigid sub-section from a pipe, a middle sub-section designed as a flexible bellows and a proximal rigid sub-section;

the proximal rigid sub-section of the lower section of the two-phase thermosiphon is in fluid communication via a 3-way connector with two inclined upper sections of the two-phase thermosiphon; these inclined upper sections are designed as two inclined pipes; the proximal ends of these inclined upper sections are sealed and supported by two supporting units installed on two posts;

a bushing, which is fastened on the rigid distal sub-section of the lower section of the two-phase thermosiphon; this bushing is joined by truss struts with a supporting structure of a parabolic dish-shaped mirror. This supporting structure, in turn, is joined with a tracking manipulator.

The tracking manipulator provides orientation of the axis of the parabolic dish-shaped mirror and, therefore, of the axis of the rigid distal sub-section of the lower section of the two-phase thermosiphon towards the sun.

The tracking manipulator can operate on the base of celestial tracking algorithm or with application of optical detectors, which determine direction of the axis of the parabolic dish-shaped mirror regarding the sun.

The tracking manipulator is joined with a supporting structure of the parabolic dish-shaped mirror at a certain point.

The tracking manipulator comprises in general two mechanisms of mutually perpendicular displacements in the horizontal plane and a mechanism of vertical displacement; an arm of the tracking manipulator, which is joined with the supporting structure of the parabolic dish-shaped mirror at a certain spot, causes by combination of these three displacements a desired azimuthal and altitude parameters of the axis of the parabolic dish-shaped mirror (these displacements depend as well on geometric and mechanical characteristics of the bellows).

The outer surface of the bellows can be protected by a braid.

The photovoltaic cells are preferably multi junction (MJ) photovoltaic cells.

An optical unit, which provides uniform illumination of the photovoltaic cells by concentrated solar radiation, can be installed below the distal low section of the two-phase thermosiphon.

Such optical units are described, for example in: Nguyen Xuan Tien and Seoyong Shin "A Novel Concentration Photovoltaic (CPV) System with the Improvement of Irradiance Uniformity and the Capturing of Diffuse Solar Radiation". The article is published in Applied Sciences 6(9):251. September 2016.

The distal sub-section of the lower section of the two-phase thermosiphon can be designed as a pipe, which is terminated with a truncated cone or a truncated pyramid. It allows to increase significantly the area of the external end butt of the plug, which seals the distal sub-section of the lower section of the two-phase thermosiphon, regarding the areas of the cross-sections of other sub-sections of the two-phase thermosiphon.

The internal end butt of the distal plug can be covered with a capillary coating in order to ensure uniform wetting of the internal end butt of the distal plug and to achieve higher heat transfer characteristics.

The upper inclined sections of the two-phase thermosiphon can be provided with external fins in order to enhance dissipation of heat released on the photovoltaic cells; this heat passes from the lower section of the two-phase thermosiphon into the inclined upper sections.

In addition, several fans can be installed on the fins of the inclined upper sections in order to improve heat transfer from the fins to the surrounding air. Diameters of the inclined upper sections of the two-phase thermosiphon can be increased in order to increase heat transfer to the surrounding air.

It should be noted that this second version of the concentrating photovoltaic module can be realized with further heat dissipation to the surroundings from the cooling medium.

The upper sub-section of the lower section of the two-phase thermosiphon can be joined with a cross-bar; the terminal sections of this cross-bar are joined, in turn, with the posts used for supporting the proximal sub-sections of the upper section of the two-phase thermosiphon.

The lower section of the two-phase thermosiphon is joined with a supporting structure of a parabolic dish-shaped mirror. This supporting structure is joined, in turn, with a tracking manipulator shown schematically.

In such a way, a photovoltaic receiver of the proposed photovoltaic module is positioned on the external end butt of the distal plug and the focal spot of the parabolic dish-shaped mirror is mostly overlapped by the photovoltaic cells of this photovoltaic receiver.

The upper sections of the two-phase thermosiphon are provided with external fins, which serve for heat dissipation by forced convection. This forced convection caused by fans installed on the external fins.

Figure 1A:
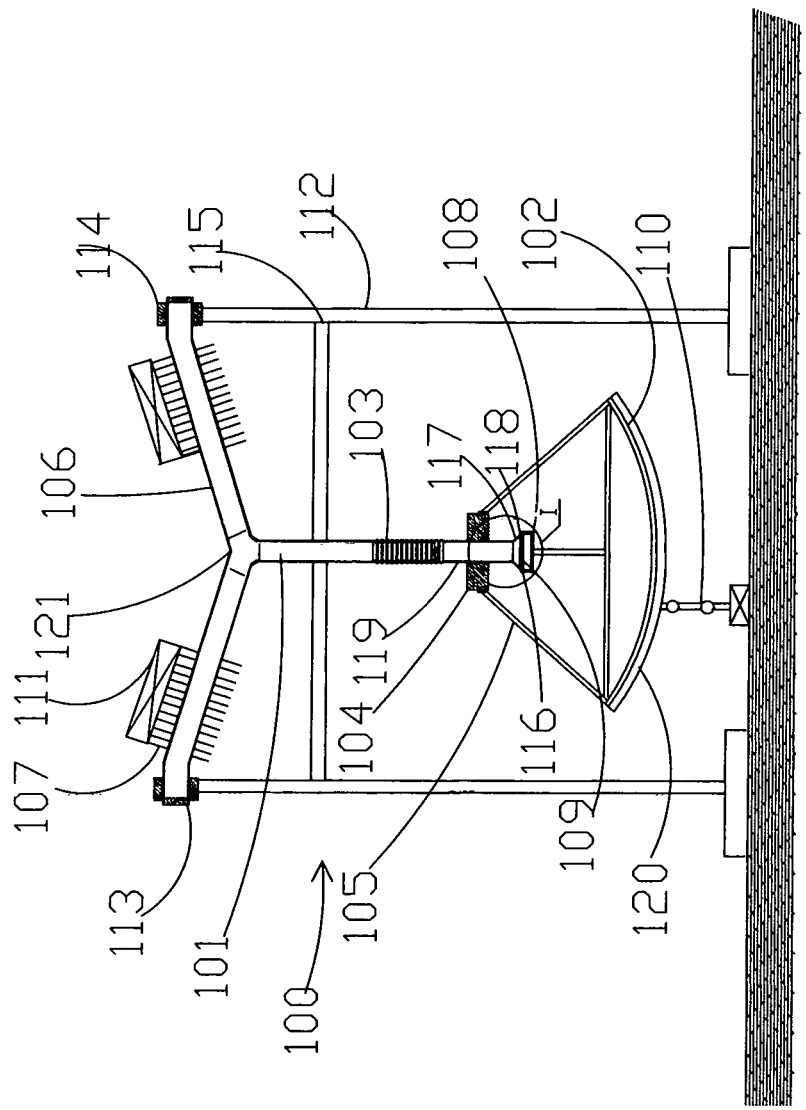
FIG. 1a shows a concentrating photovoltaic module, which comprises a two-phase thermosiphon (its axial cross-section) serving for removal of heat generated on photovoltaic cells installed on the external end butt of a distal plug sealing this two-phase thermosiphon.
Figure 1B:
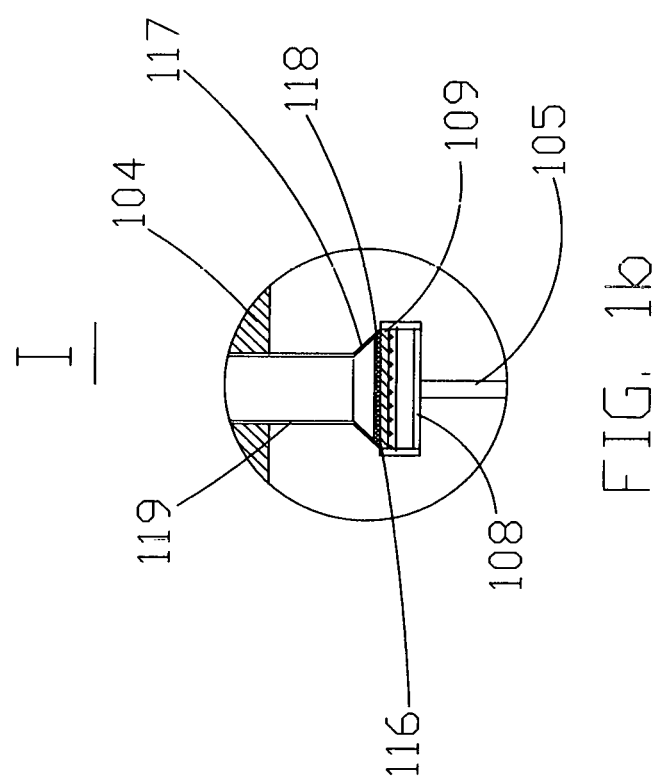

FIG. 1b shows an enlarged axil cross-section of the two-phase thermosiphon at its distal part with photovoltaic cells installed on the external end butt of its distal plug.

DETAILED DESCRIPTION OF THE INVENTION

FIG. 1a shows a concentrating photovoltaic module, which comprises a two-phase thermosiphon (its axial cross-section) serving for removal of heat generated on photovoltaic cells installed on the external end butt of the distal plug sealing this two-phase thermosiphon. The lower section of the two-phase thermosiphon is joined with a parabolic dish-shaped mirror, which, in turn, is joined with a tracking manipulator shown schematically.

The upper sections of the two-phase thermosiphon are provided with external fins, which serve for heat dissipation by forced convection. This forced convection is caused by fans installed on the external fins.

In such a way, the concentrating photovoltaic module comprises: a two-phase thermosiphon 100 with its lower section including, in turn, an upper rigid sub-section 101, bellows 103, a distal rigid sub-section 119, which is terminated with a conical member 117; this conical member 117 is sealed by plug 116; photovoltaic cells 109 are fastened on the external end butt of this plug 116 and its internal end butt is covered with a capillary coating 118.

Bushing 104 is installed on the distal rigid sub-section 119 of the lower section of the two-phase thermosiphon 100; this bushing 104 serves for installation of a parabolic dish-shaped mirror 102; a supporting structure 120 of the parabolic dish-shaped mirror is joined with bushing 104 by truss struts 105.

A tracking manipulator 110 is joined with the supporting structure 120 of the parabolic dish-shaped mirror 102 at a certain point of the supporting structure 120.

There is an optical unit 108 arranged below the lower section of the two-phase thermosiphon 100; this optical unit 108 provides uniform illumination of the photovoltaic cells by concentrated solar radiation obtained from the parabolic dish-shaped mirror 102.

An upper rigid sub-section 101 of the lower section of the two-phase thermosiphon 100 is joined by cross-bar 115 with posts 112; it provides mechanical rigidity to the upper rigid sub-section 101 of the lower section of the two-phase thermosiphon 100.

There are two inclined upper sections 106 of the two-phase thermosiphon 100, these upper inclined sections 106 are in fluid communication with the lower section of the two-phase thermosiphon 100 via a metal 3-way connector 121.

The proximal sub-sections of the upper sections are sealed with plugs 113; these proximal sub-sections are supported by supporting members 114 installed on posts 112.

The external surface of the upper sections of the two-phase thermosiphon are provided with fins 107 and fans 111 for enhancement of forced convection from these fins 107 to the environment.

FIG. 1b shows a detailed axil cross-section of the two-phase thermosiphon at its distal part with the photovoltaic cells installed on the external end butt of its distal plug.

It comprises the lower sub-section 119 of the lower section of the two-phase thermosiphon 100; bushing 104 is installed on this lower sub-section 119.

The lower rigid sub-section 119 is terminated at its distal part with a truncated cone 117, which is sealed with plug 116. The photovoltaic cells 109 are installed on the external end butt of plug 116; its internal end butt is covered with the capillary coating 118.

The optical unit 108 is arranged below the photovoltaic cells 109.

Bushing 104 is joined with the truss strut 105.

REFERENCES CITED

U.S. Patent Documents
U.S. Pat. No. 4,045,246 Aug. 1977 Mlaysky et al.
414647 Mar. 1979 Litsenko et al.

U.S. Pat. No. 4,211,581 July 19 80 Vasilinina et al.
U.S. Pat. No. 4,830,678 May 1989 Todorof et al.
U.S. Pat. No. 5,269,851 Dec. 1993 Horne
U.S. Pat. No. 5,374,317 Dec. 1994 Lamb et al.
U.S. Pat. No. 5,522,944 Jun. 1996 Elazari
552954 Jun. 1996 Shoen
U.S. Pat. No. 6,080,927 Jun. 2000 Johnson
U.S. Pat. No. 9,022,020 May 2015 Mills et al
U.S. Pat. No. 9,437,766 Sep. 2016 Escher
Ser. No. 10/320,328 Jun. 2019 Escher
2008/0041441 Feb. 2008 Schwartzman
2011/0017199 Jan. 2011 Hernandez

OTHER REFERENCES

William G. Anderson et al. "Heat Pipe Cooling of Concentrating Photovoltaic (CPV) Systems" American Institute of Aeronautics and Astronautics, July 2008.

Gur Mittelman, et al. "Solar Cooling With Concentrating Photovoltaic/thermal (CPVT) Systems," Elsevier, Engergy and Conversion Management, 48, 2007, pp. 2481-2490. cited by applicant P. W. Ruch, et al., "Building a smarter Energy Future," Smart Energy Day, IBM, 2010, pp. 1-30

P. W. Ruch, et al., "Recycling Thermal Energy Boosts Efficiencies in Datacenters and Concentrated Photovoltaic Systems," IBM, Smart Energy Strategies Conference ETH Zurich, 2011, pp. 1-24.

Akbarzadeh, A., and Wadowski, T., "Heat Pipe-Based Cooling Systems for Photovoltaic Cells Under Concentrated Solar Radiation," Applied Thermal Engineering, 16(1), pp. 81-87, 1996.

Beach, R. T., and White, R. M., "Heat Pipe for Passive Cooling of Concentration Solar Cells," Proceedings of the 15th IEEE Photovoltaic Specialists Conference, pp. 75-80, Kissimmee, F L, May 12-15, 1981.

Farahat, M. A., "Improvement in the Thermal Electric Performance of a Photovoltaic Cells by Cooling and Concentration Techniques," proceeding of the 39th International Universities Power Engineering Conference (UPEC 2004), IEEE, New York, N.Y., ISBN: 1-86043-365-0, pp. 623-628, Sep. 6-8, 2004.

Feldman, K. T., Kenney, D. D., and Edenburn, M. W., "A Passive Heat Pipe Cooled Photovoltaic Receiver," Proceedings of the 15th IEEE Photovoltaic Specialists Conference, pp. 165-172, Kissimmee, F L, May 12-15, 1981.

Royne, A., Dey, C. J., and Mills, D. R., "Cooling of Photovoltaic Cells Under Concentrated Illumination: A Critical Review," Solar Energy Materials and Solar Cells, 86(4), pp. 451-483, April 2005.

M. K. Bezrodny et al. "TRANSFER PROCESSES IN TWO-PHASE THERMOSIPHON SYSTEMS. Theory and Practice", Kiev 2005 (in Russian) http://solar-prosearch.co/breakthrough-solar-energy-technology-from-israel-hebrew-subtitles/

The invention claimed is:

1. A concentrating photovoltaic module comprising the following elements and units:

a two-phase thermosiphon intended to reject heat from photovoltaic cells being installed on an external end butt of a plug sealing a lower section of said two-phase thermosiphon; said lower section of said two-phase thermosiphon is divided into three sub-sections: a distal rigid sub-section from a pipe, a middle sub-section designed as a flexible bellows and a proximal rigid sub-section from another pipe, which is substantially oriented vertically;

said proximal rigid sub-section of said lower section of said two-phase thermosiphon is in fluid communication via a metal 3-way connector with two inclined upper sections shaped as pipes; wherein proximal ends of said inclined upper sections are sealed and supported by two supporting units installed on two posts;

a bushing, which is fastened on said rigid distal sub-section of said lower section of said two-phase thermosiphon; said bushing is joined by truss struts with a supporting structure of a parabolic dish-shaped mirror;

a focal spot of said parabolic dish-shaped mirror illuminates said photovoltaic cells; a tracking manipulator, which is joined with said supporting structure; said tracking manipulator provides orientation of an axis of said parabolic dish-shaped mirror and an axis of said rigid distal sub-section of said lower section of said two-phase thermosiphon towards the sun; an outer surface of said bellows is protected by a braid; said inclined upper sections of said two-phase thermosiphon are provided with external fins.

2. The concentrating photovoltaic module as claimed in claim 1, wherein there is an optical unit, which provides uniform illumination of the photovoltaic cells installed on the external end butt of the plug of the lower section of the two-phase thermosiphon; said optical unit is installed between said external end butt and the parabolic dish-shaped mirror.

3. The concentrating photovoltaic module as claimed in claim 1, wherein there are fans installed on the fins of the upper sections of the two-phase thermosiphon.

4. The concentrating photovoltaic module as claimed in claim 1, wherein the distal sub-section of the lower section of the two-phase thermosiphon is terminated with a truncated cone, which is sealed with the plug serving for installation of the photovoltaic cells on its external end butt.

5. The concentrating photovoltaic module as claimed in claim 1, wherein the photovoltaic cells are multi-junction photovoltaic cells.

6. The concentrating photovoltaic module as claimed in claim 1, wherein the proximal rigid sub-section of the lower section of the two-phase thermosiphon is joined with the posts by a cross-bar.

7. The concentrating photovoltaic module as claimed in claim 1, wherein an internal end butt of the plug sealing the distal sub-section of the lower section of the two-phase thermosiphon is covered with a capillary coating.

* * * * *